(12) United States Patent
Bryant et al.

(10) Patent No.: US 8,835,191 B2
(45) Date of Patent: Sep. 16, 2014

(54) NANOWIRE STRESS SENSORS AND STRESS SENSOR INTEGRATED CIRCUITS, DESIGN STRUCTURES FOR A STRESS SENSOR INTEGRATED CIRCUIT, AND RELATED METHODS

(71) Applicant: International Business Machines Corporation, Armonk, NY (US)

(72) Inventors: Andres Bryant, Burlington, VT (US); Oki Gunawan, Fair Lawn, NJ (US); Shih-Hsien Lo, Mount Kisco, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/764,169

(22) Filed: Feb. 11, 2013

(65) Prior Publication Data
US 2013/0145857 A1    Jun. 13, 2013

Related U.S. Application Data

(62) Division of application No. 12/605,523, filed on Oct. 26, 2009, now Pat. No. 8,614,492.

(51) Int. Cl.
| | |
|---|---|
| H01L 21/00 | (2006.01) |
| B82Y 35/00 | (2011.01) |
| B82Y 10/00 | (2011.01) |
| H01L 29/66 | (2006.01) |
| G01B 7/16 | (2006.01) |
| H01L 29/06 | (2006.01) |
| H01L 29/775 | (2006.01) |
| H01L 29/84 | (2006.01) |
| B82Y 40/00 | (2011.01) |
| H01L 29/04 | (2006.01) |

(52) U.S. Cl.
CPC .......... *H01L 29/66477* (2013.01); *B82Y 10/00* (2013.01); *B82Y 40/00* (2013.01); *G01B 7/18* (2013.01); *H01L 29/0665* (2013.01); *G01B 7/16* (2013.01); *H01L 29/045* (2013.01); *H01L 29/775* (2013.01); *H01L 29/66439* (2013.01); *Y10S 977/724* (2013.01); *Y10S 977/938* (2013.01); *Y10S 977/956* (2013.01)
USPC ............... 438/10; 438/17; 257/415; 257/417; 977/724; 977/938; 977/956

(58) Field of Classification Search
USPC ......... 977/724–725, 732, 733, 936–938, 956; 257/254, 415; 438/17
See application file for complete search history.

(56) References Cited

U.S. PATENT DOCUMENTS

| | | | | |
|---|---|---|---|---|
| 4,894,698 | A | * | 1/1990 | Hijikigawa et al. ........... 257/254 |
| 6,815,277 | B2 | * | 11/2004 | Fried et al. .................... 438/198 |

(Continued)

OTHER PUBLICATIONS

USPTO, Office Action issued in U.S. Appl. No. 12/605,523 dated Jun. 19, 2013.

(Continued)

*Primary Examiner* — Cheung Lee
*Assistant Examiner* — Jeremy Joy
(74) *Attorney, Agent, or Firm* — Wood, Herron & Evans LLP; Anthony J. Canale

(57) ABSTRACT

Methods for sensing a mechanical stress and methods of making stress sensor integrated circuits. The sensing methods include transferring the mechanical stress from the object to one or more nanowires in a stress sensor or stress sensor circuit and permitting the nanowires to change in length in response to the mechanical stress. An electrical characteristic of the stress sensor or stress sensor circuit, which has a variation correlated with changes in the magnitude of the mechanical stress, is measured and then assessed to determine the stress magnitude. The manufacture methods include electrically connecting nanowire field effect transistors having, as channel regions, one or more nanowires of either a different crystalline orientation or a different body width for the individual nanowires so that an offset output voltage results when mechanical strain is applied to the nanowires.

17 Claims, 11 Drawing Sheets

(56) References Cited

U.S. PATENT DOCUMENTS

| | | | |
|---|---|---|---|
| 6,913,649 B2 | 7/2005 | Voutsas et al. | |
| 7,195,733 B2 | 3/2007 | Rogers et al. | |
| 7,208,815 B2 * | 4/2007 | Chen et al. | 257/627 |
| 7,241,653 B2 | 7/2007 | Hareland et al. | |
| 7,256,466 B2 | 8/2007 | Lieber et al. | |
| 7,260,980 B2 | 8/2007 | Adams et al. | |
| 7,553,681 B2 * | 6/2009 | Raravikar et al. | 438/15 |
| 7,994,593 B2 * | 8/2011 | Takulapalli et al. | 257/414 |
| 8,256,293 B2 * | 9/2012 | Rueger | 73/579 |
| 8,519,449 B2 * | 8/2013 | Dumitru et al. | 257/254 |
| 2006/0010996 A1 * | 1/2006 | Jordan et al. | 73/866.1 |
| 2007/0145431 A1 * | 6/2007 | Kim et al. | 257/288 |
| 2007/0222472 A1 * | 9/2007 | Raravikar et al. | 324/765 |
| 2008/0230853 A1 * | 9/2008 | Jang et al. | 257/401 |
| 2009/0146194 A1 * | 6/2009 | Moselund et al. | 257/288 |
| 2009/0179268 A1 | 7/2009 | Abou-Khalil et al. | |
| 2010/0171569 A1 * | 7/2010 | Ionescu et al. | 333/185 |
| 2010/0193770 A1 * | 8/2010 | Bangsaruntip et al. | 257/24 |
| 2010/0295020 A1 * | 11/2010 | Barwicz et al. | 257/24 |
| 2010/0330687 A1 * | 12/2010 | Afzali - Ardakani et al. | 436/149 |
| 2011/0023632 A1 * | 2/2011 | Bhat et al. | 73/862.626 |
| 2011/0062418 A1 * | 3/2011 | Ludwig | 257/24 |
| 2011/0215002 A1 * | 9/2011 | Martinez | 205/777.5 |

OTHER PUBLICATIONS

Y.P. Shikolnikov, et al., "Applied Physics", Lett 85, 3766 (2004).

Richard C. Jaeger, et al., CMOS Stress Sensor Circuits Using Piezoresistive Field-Effect Transistors (PIFETs), pp. 42-43, 1995 Symposium on VLSI Circuits Digest of Tech. Papers.

USPTO, Office Action issued in related U.S. Appl. No. 12/605,523 dated Nov. 23, 2012.

* cited by examiner

NANOWIRE STRESS SENSORS AND STRESS SENSOR INTEGRATED CIRCUITS, DESIGN STRUCTURES FOR A STRESS SENSOR INTEGRATED CIRCUIT, AND RELATED METHODS

CROSS-REFERENCE TO RELATED APPLICATIONS

This application is a divisional of application Ser. No. 12/605,523, filed Oct. 26, 2009, which is hereby incorporated by reference herein in its entirety.

BACKGROUND

The invention relates generally to semiconductor device fabrication and, in particular, to methods of fabricating stress sensors and sensor integrated circuits incorporating one or more nanowire field effect transistors, as well as methods of sensing stress using one or more nanowire field effect transistors.

The electrical detection of mechanical stress is critical in many applications, such as measuring an external force applied to an object. Knowledge of mechanical stresses may be used as a factor in the electronic device phase to predict the performance of an integrated circuit. As another example, a packaging process may be modified to mitigate excessive mechanical stresses. Conventional analog complementary metal-oxide-semiconductor (CMOS) stress sensors have been proposed and used for stress sensing. A typical conventional stress sensor relies on the piezo-resistive performance of metal-oxide-semiconductor field effect transistors (MOSFETs). Of course, another solution for the electrical detection of mechanical stress is the use of a conventional strain gauge.

When die are mounted and packaged, mechanical stresses are inherently introduced into the die package and additional mechanical stresses are introduced during integrated circuit operation. Moderate mechanical stresses may impair the electrical performance of the integrated circuit. At higher mechanical stresses, the integrated circuit may experience a partial or complete failure of functionality that is reversible. Further increases in the mechanical stress applied to the semiconductor material of the die may initiate a crack, which may propagate and result in fracture. If cracking or fracture occurs, the resultant damage to the integrated circuit is likely irreversible.

Components fabricated with the emerging technologies of microelectromechanical systems (MEMS) are being incorporated in an increasing number of consumer applications including, but not limited to, automotive electronics, medical equipment, cell phones, hard disk drives, computer peripherals, and wireless devices. In MEMS technologies, mechanical elements, sensors, actuators, and electronics are integrated on a common silicon substrate through microfabrication technology.

Methods for fabricating stress sensors and stress sensor circuits, as well as methods for sensing mechanical stress, are needed that overcome the disadvantages of conventional fabrication methods and stress sensing methods for these types of devices and circuits.

BRIEF SUMMARY

In an embodiment of the invention, a stress sensor is provided that includes a first field effect transistor with a first source region electrically connected to a constant current source, a first drain region, and one or more first nanowires extending from the first source region to the first drain region. A first gate electrode extending circumferentially about the one or more first nanowires at a location between the first source region and the first drain region. The stress sensor further includes a second field effect transistor with a second source region electrically connected to the constant current source, a second drain region, and one or more second nanowires extending from the second source region to the second drain region. The second field effect transistor further includes a second gate electrode extending circumferentially about the one or more second nanowires between the second source region and the second drain region. The one or more first nanowires and the one or more second nanowires are configured to change in length in response to the mechanical stress transferred from the object. A first voltage output from the first drain region of the first field effect transistor is not equal to a second voltage output from the second drain region of the second field effect transistor.

In another embodiment, the stress sensor is included in a design structure, which is embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

In another embodiment of the invention, a stress sensor includes a first field effect transistor with a first source region electrically connected to a positive power supply node, a first drain region, and one or more first nanowires extending from the first source region to the first drain region. A first gate electrode extends circumferentially about the one or more first nanowires at a location between the first source region and the first drain region. The stress sensor further includes a second field effect transistor with a second source region electrically connected to the positive power supply node, a second drain region, and one or more second nanowires extending from the second source region to the second drain region. A second gate electrode extends circumferentially about the one or more second nanowires between the second source region and the second drain region. The one or more first nanowires and the one or more second nanowires are configured to change in length in response to the mechanical stress transferred from the object. A first voltage output from the drain region of the first field effect transistor is not equal to a second voltage output from the drain region of the second field effect transistor.

In an embodiment of the invention, a method is provided for sensing a mechanical stress applied to an object. The method includes transferring the mechanical stress from the object to at least one nanowire in a stress sensor mechanically coupled with the object and, in response to the mechanical stress, permitting the at least one nanowire of the stress sensor to change in length. In response to the at least one nanowire of the stress sensor changing in length, a numerical value for an electrical characteristic of the stress sensor is measured. The method further includes determining a magnitude of the mechanical stress from the numerical value of the electrical characteristic.

In another embodiment of the invention, a method is provided for sensing a mechanical stress applied to an object. The method includes transferring the mechanical stress from the object to at least one nanowire acting as a channel region in a first field effect transistor and at least one nanowire acting as a channel region in a second field effect transistor that is connected in parallel with the first field effect transistor. In response to the mechanical stress, the at least one nanowire of the first field effect transistor and the at least one nanowire of the second field effect transistor are each permitted to each change in length. In response to the changes in length, a difference between a first voltage output from the first field effect transistor and a second voltage output from the second field effect transistor is determined. The method further includes determining a value for the mechanical stress from the difference between the first and second voltages.

In another embodiment of the invention, a method is provided for making a stress sensor circuit configured to generate an output voltage offset for sensing a mechanical stress. The method includes forming a first field effect transistor that includes at least one nanowire acting as a channel region and forming a second field effect transistor that includes at least one nanowire acting as a channel region. The at least one nanowire of the second field effect transistor has at least one of a different body width or a different crystalline orientation than the at least one nanowire of the first field effect transistor. The method further includes electrically connecting the first and second field effect transistors in the stress sensor circuit so that a length change of the at least one nanowire of the first field effect transistor and the at least one nanowire of the first field effect transistor in response to the mechanical stress produces the output voltage offset.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
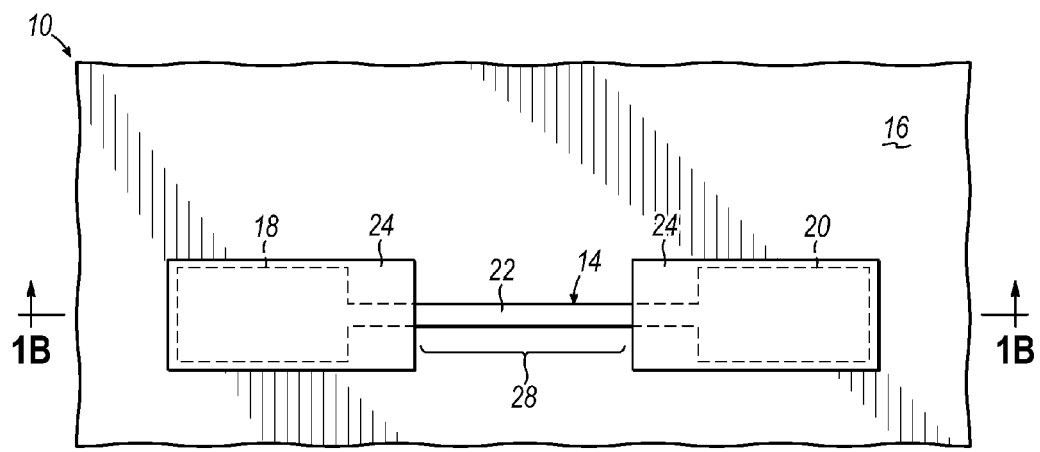
FIG. 1A is a diagrammatic top view of a portion of a substrate at an initial fabrication stage of a processing method for fabricating a device structure for use in an embodiment of the invention.
Figure 1B:
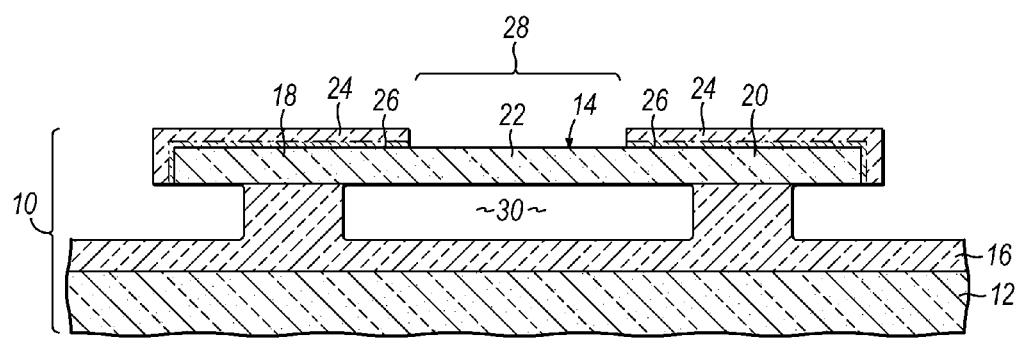
FIG. 1B is a cross-sectional view taken generally along lines 1B-1B of FIG. 1A.

With reference to FIGS. 1A, 1B and in accordance with an embodiment of the invention, a semiconductor-on-insulator (SOI) wafer 10 includes a handle substrate 12, an active semiconductor or SOI layer 14, and a buried insulator layer 16 formed of a dielectric material. The buried insulator layer 16 may be a buried oxide layer composed of silicon dioxide (e.g., $SiO_2$). The SOI layer 14 is separated from the handle substrate 12 by the intervening buried insulator layer 16. The SOI layer 14 is composed of single crystal or monocrystalline silicon (Si) or, alternatively, another material that is primarily composed of silicon such as an alloy of Si and germanium (Ge). The handle substrate 12 may also be composed of single crystal or monocrystalline silicon, or another type of material. The buried insulator layer 16 electrically isolates the handle substrate 12 from the SOI layer 14, which is considerably thinner than the handle substrate 12 and is in direct contact with a top surface of the buried insulator layer 16.

The SOI layer 14 is patterned with a conventional lithography and anisotropic etching process using a hardmask (not shown) that etches selectively to the semiconductor material constituting the SOI layer 14. After patterning, the SOI layer 14 includes mesas 18, 20 and a significantly thinner beam 22 extending laterally between the mesas 18, 20. The beam 22 may be patterned with a minimum feature size. After the mesas 18, 20 and beam 22 are defined, the hardmask is removed.

Another hardmask 24 is applied to the top surface 26 of the mesas 18, 20 and beam 22 remaining from the patterned SOI layer 14. The hardmask 24 includes a layer stack consisting of a layer of silicon nitride ($Si_3N_4$) and a thinner layer of silicon dioxide ($SiO_2$) between the $Si_3N_4$ layer and the top surface 26. The capping layer of the hardmask 24 is composed of a material that is removed by etching selectively to the semiconductor material constituting the SOI layer 14 and that is readily removed at a subsequent fabrication stage by a different etchant. The hardmask 24 is patterned using a conventional lithography and anisotropic etching process involving a patterned resist layer (not shown) to define a window 28 centrally located between the mesas 18, 20. The window 28 in the hardmask 24 exposes a central portion of the beam 22.

An isotropic etching process, such as a timed hydrogen fluoric acid (HF) dip, is applied to partially remove the buried insulator layer 16 from beneath the central portion of the beam 22 and, thereby, define a cavity 30. As a result, the central portion of the beam 22 is no longer supported by the buried insulator layer 16 and spans across the cavity 30 between the mesas 18, 20. The isotropic etching process also slightly undercuts the buried insulator layer 16 beneath the mesas 18, 20. However, the mesas 18, 20 are still mechanically supported by the buried insulator layer 16. The mesas 18, 20 provide the mechanical support for the beam 22, which is suspended across the clearance provided by the cavity 30.

Figure 2A:
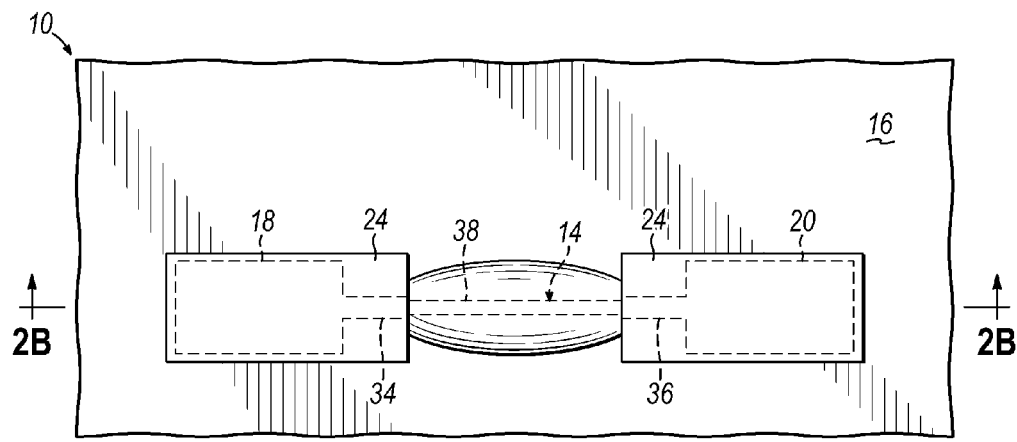
FIGS. 2A and 2B are views similar to FIGS. 1A and 1B, respectively, at a subsequent fabrication stage of the processing method.
Figure 2B:
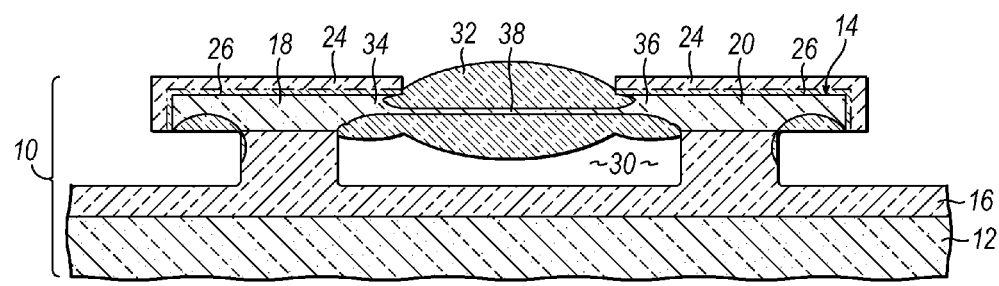

With reference to FIGS. 2A, 2B in which like reference numerals refer to like features in FIGS. 1A, 1B and at a subsequent fabrication stage, the central portion of the beam 22 is subjected to stress-limited oxidation that produces an oxide layer 32 on the central portion of the beam 22 exposed by window 28 and the surface areas of the mesas 18, 20 exposed by the cavity 30. The hardmask 24 masks the top surface 26 and sidewall of the mesas 18, 20, as well as the top surface 26 of the peripheral ends 34, 36 of the beam 22 respectively disposed between the central portion of the beam 22 and the mesas 18, 20. The presence of the cavity 30 causes the oxidation of the central portion of the beam 22 to proceed symmetrically about its circumference.

As the silicon of the central portion of the beam 22 is consumed, the oxidation rate of the central portion of the beam 22 is limited by the stresses in the building thickness of the surrounding cocoon of oxide layer 32. As appreciated by a person having ordinary skill in the art, stresses at the inwardly advancing silicon/oxide interface that arise from the oxide volume expansion progressively slow the oxidation rate by making the transition of Si to $SiO_2$ less energetically favorable. Eventually, at a certain minimum body width for a nanowire 38 (FIGS. 3A, 3B) residing at the core of the oxide layer 32, oxidation slows down to a negligible rate. Because the oxidation process may be rather lengthy (i.e., several hours), the hardmask 24 is necessary to protect the top surface of the mesas 18, 20 and the thickness of the hardmask 24 is chosen accordingly.

Figure 3A:
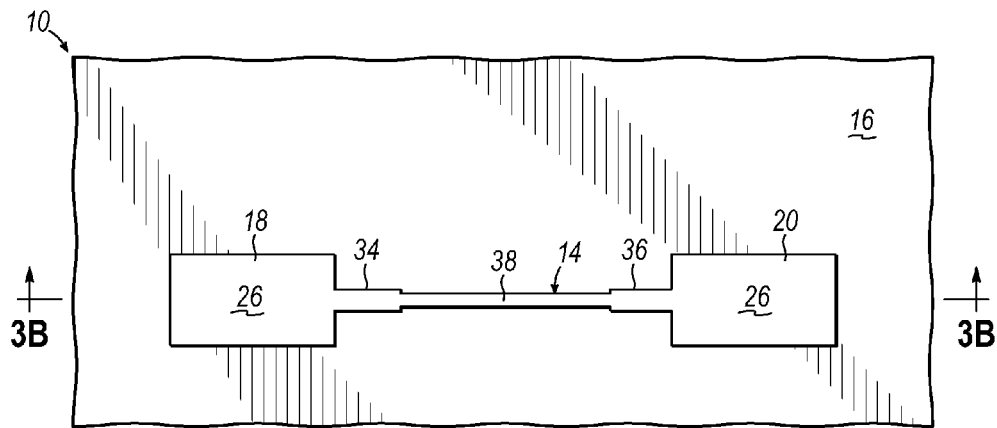
FIGS. 3A and 3B are views similar to FIGS. 2A and 2B, respectively, at a subsequent fabrication stage of the processing method.
Figure 3B:
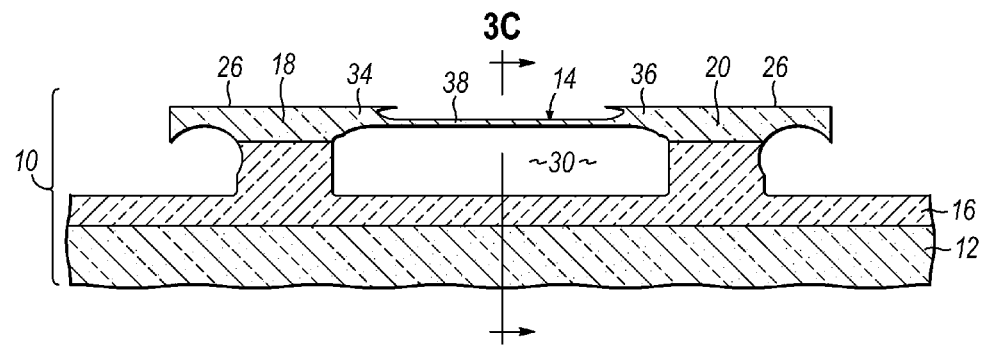
Figure 3C:
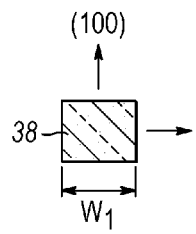
FIG. 3C is a view taken generally along lines 3C-3C of FIG. 3B.

With reference to FIGS. 3A, 3B in which like reference numerals refer to like features in FIGS. 2A, 2B and at a subsequent fabrication stage, the oxide layer 32 is removed with a conventional etching process to expose the nanowire 38 of silicon, which has a body width, $W_1$ as best shown in FIG. 3C. In one embodiment, the body width of the nanowire 38 may lie in a range of about 4 nanometers (nm) to about 15 nm. The residual peripheral ends 34, 36 of the original beam 22, which are thinned to a lesser extent by the stress-limited oxidation, respectively connect the nanowire 38 with the mesas 18, 20. The hardmask 24 is removed from the mesas 18, 20, as well as the peripheral ends 34, 36 of the original beam 22, utilizing a conventional wet chemical stripping process, such as a wet phosphoric acid etch. The nanowire 38 is inherently under tensile stress and, therefore, strained.

In alternative embodiments, the nanowire 38 may have a different crystalline orientation or a different body width than illustrated in the representative embodiment of FIG. 3C.

Figure 3D:
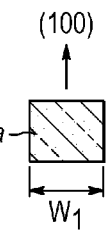
FIG. 3D is a view similar to FIG. 3C depicting a nanowire with the same body width as the nanowire of FIG. 3C and a different crystalline orientation.

For example and as shown in FIG. 3D, a nanowire 38a is formed with a different crystalline orientation than nanowire 38 (FIG. 3C) but is otherwise substantially similar to nanowire 38. The SOI layer 14 and, therefore, the nanowire 38 have a diamond lattice structure characteristic of silicon. For example, if SOI layer 14 has a (100) surface normal and a diamond lattice structure, then the beam 22 can be oriented to have either a (100) orientation or a (110) orientation. The nanowire 38a, which formed from the beam 22, will inherit the same orientation. If SOI layer 14 has a (100) surface normal and a diamond lattice structure, the included angle between adjacent (100) and (110) planes in this particular crystal lattice is 45° ($\pi/8$ radians). Nanowire 38a is formed with the beam 22 originally aligned in a (100) direction, as shown in FIG. 3C, whereas nanowire 38 is formed with the beam 22 originally aligned in, for example, a (110) direction, as shown in FIG. 3B. As a result of alignment with two different crystal orientations, the carrier mobility in the nanowires 38, 38a under nominally equivalent conditions will differ as carrier mobility in silicon and similar silicon-containing materials exhibits a known crystal orientation dependence.

The crystalline of the nanowires 38, 38a are representative and may differ from the depictions in FIGS. 3C, 3D. For example, the nanowires 38, 38a may be aligned along a different set of crystalline orientations (e.g., (100) and (111)) if the surface normal is different than illustrated in FIGS. 3C, 3C. As appreciated by a person having ordinary skill in the art, the silicon crystal lattice has three primary orientation planes, namely the (100), (110), and (111) planes, the orientation of the SOI layer 14 is classified by the orientation plane that the surface of the SOI layer 14 is parallel to, and the planes intersecting any particular surface normal for SOI layer 14 will vary.

Figure 3E:
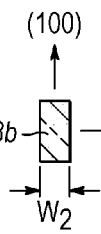
FIG. 3E is a view similar to FIG. 3C depicting a nanowire with a different body width than the nanowire of FIG. 3C and the same crystalline orientation.

As another example and as shown in FIG. 3E, a nanowire 38b is formed with a smaller body width, $W_2$, than the body width, $W_1$, of nanowire 38 (FIG. 3C) but is otherwise substantially similar to nanowire 38. The body width may be varied by an appropriate selection of the parameters chosen for the stress-limited oxidation process and the initial dimensions of the beam 22. Because of the nature of the stress-limited oxidation process, a large process window is available for controlling the body width of the nanowires 38, 38b. The carrier mobility in the nanowires 38, 38b under nominally equivalent external conditions will differ as a function of body width.

Figure 7:
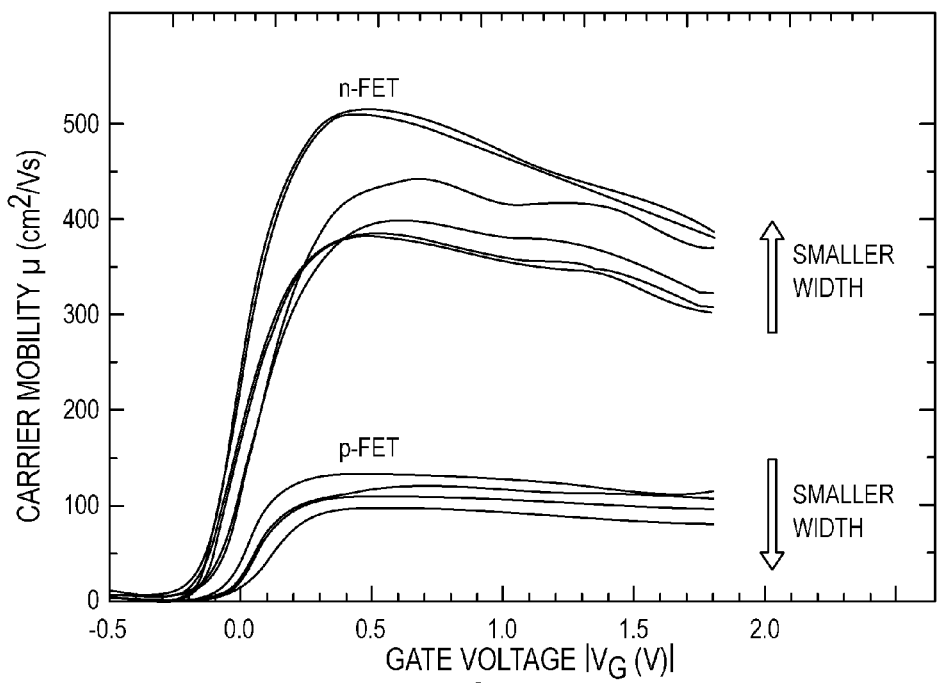
FIG. 7 is a graphical view showing the dependence of carrier mobility on nanowire body width for n-channel and p-channel GAA nanowire field effect transistors.

The body width dependency is graphically shown in FIG. 7, which plots curves of carrier mobility as a function of gate voltage for nanowire field effect transistors of different body width. As depicted in FIG. 7, the carrier mobility for n-channel nanowire field effect transistors increases with decreasing body width. In contrast, the carrier mobility for p-channel nanowire field effect transistors decreases with decreasing body width. The observed width dependence of the carrier mobility on nanowire stress may permit larger sensitivities with aggressive scaling downwards in beam size and additionally, may permit the design and production of a range of amplifiers with different widths to cover measurement of a wide range of stress values.

The widths, $W_1$ and $W_2$, and cross-sectional aspect ratios of the nanowires 38, 38b are representative and may differ from the representative depictions in FIGS. 3C, 3E. For example, instead of being smaller, the width, $W_2$, of nanowire 38b may be greater than the width, $W_1$, of nanowire 38.

Figure 3F:
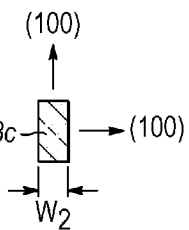
FIG. 3F is a view similar to FIG. 3C depicting a nanowire with a different body width than the nanowire of FIG. 3C and a different crystalline orientation.

As shown in FIG. 3F, a nanowire 38c is formed with a smaller body width, $W_2$, than the body width, $W_1$, of nanowire 38 (FIG. 3C) and with a different crystalline orientation than nanowire 38 (FIG. 3C), but is otherwise substantially similar to nanowire 38.

Figure 4A:
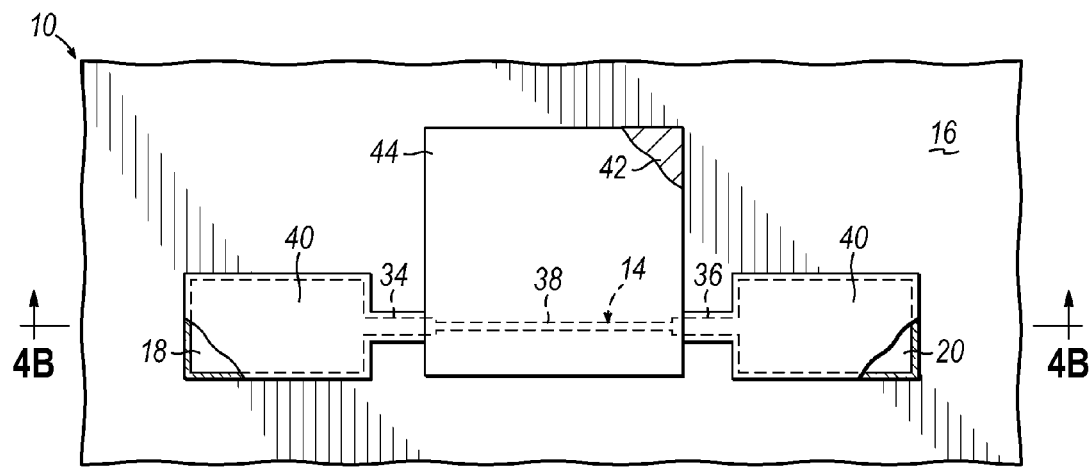
FIGS. 4A and 4B are views similar to FIGS. 3A and 3B, respectively, at a subsequent fabrication stage of the processing method.
Figure 4B:
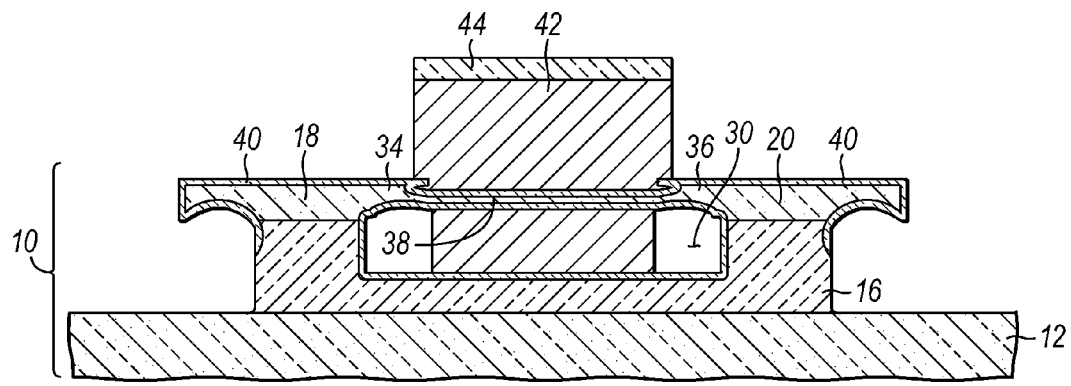

With reference to FIGS. 4A, 4B in which like reference numerals refer to like features in FIGS. 3A, 3B and at a subsequent fabrication stage, a gate dielectric layer 40 is formed on the nanowire 38, as well as other exposed surfaces. The gate dielectric layer 40 may have a physical layer thickness ranging from about one (1) nm to about ten (10) nm. In one embodiment, the gate dielectric layer 40 may be oxide formed by a wet or dry thermal oxidation process. The gate dielectric layer 40 covers the entire circumference of the nanowire 38. Alternatively, the gate dielectric layer 40 may be composed of silicon oxynitride ($SiO_xN_y$), $Si_3N_4$, or a high-k dielectric like hafnium oxide ($HfO_2$), hafnium oxynitride (HfSiON), or zirconium oxide ($ZrO_2$) that is characterized by a relatively high permittivity, or layered stacks of these and other dielectric materials.

A gate electrode 42 is defined by depositing a blanket conductor layer, forming a patterned hardmask 44 on the blanket conductor layer, and using an anisotropic etching process to remove portions of the blanket conductor layer not masked by the patterned hardmask 44. This unmasked region of the patterned hardmask 44 is registered approximately with the nanowire 38. The conductor fills the cavity 30 so that the gate electrode 42 encircles the circumference of the nanowire 38 in a gate all around construction. The gate dielectric layer 40 is disposed between the nanowire 38 and the gate electrode 42 and performs an electrical isolation function.

In one embodiment, the gate electrode 42 is composed of doped polysilicon, which is characterized by a significantly higher electrical conductivity than the gate dielectric layer 40. The polysilicon of the gate electrode 42 may be deposited by a chemical vapor deposition (CVD) process. Alternatively, the gate electrode 42 may composed of a different material, such as a metal, a metal silicide, or a layered stack of these conductive materials with each other or with polysilicon. The hardmask 44 is composed of a dielectric material, such as $Si_3N_4$, formed by a conventional deposition process, such as a CVD process.

Figure 5A:
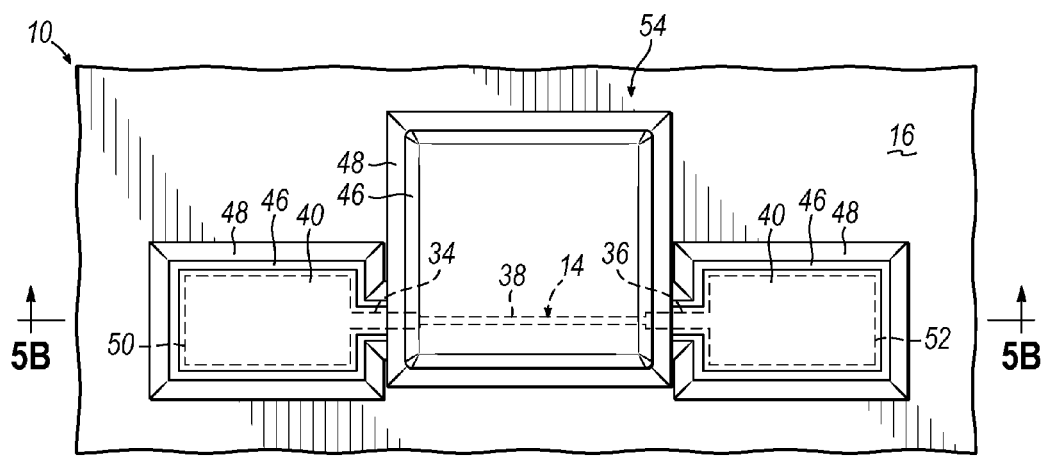
FIGS. 5A and 5B are views similar to FIGS. 4A and 4B, respectively, at a subsequent fabrication stage of the processing method.
Figure 5B:
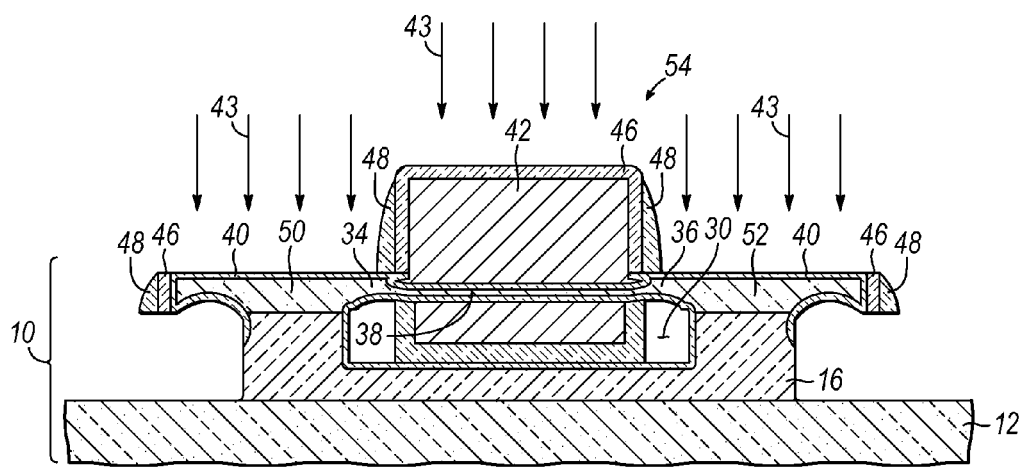

With reference to FIGS. 5A, 5B in which like reference numerals refer to like features in FIGS. 4A, 4B and at a subsequent fabrication stage, the hardmask 24 is removed using a conventional wet chemical stripping process, such as a wet phosphoric acid etch. A screen layer 46 of, for example, $SiO_2$ is formed on the top surfaces in anticipation of a subsequent ion implantation. Sidewall spacers 48 are formed on the sidewalls of the gate electrode 42, as well as the mesas 18, 20 by a conventional spacer formation process. The sidewall spacers 48 may be formed by depositing a conformal layer of an electrically insulating material, such as about ten (10) nanometers to about fifty (50) nanometers of $Si_3N_4$ deposited by CVD, across the SOI layer 14 and anisotropic etching the conformal layer to preferentially remove the electrically insulating material from horizontal surfaces.

The mesas 18, 20 are converted to source and drain regions 50, 52, respectively, by doping the constituent semiconductor material. In one embodiment, the source and drain regions 50, 52 are defined using an ion implantation process that implants energetic ions, as indicated diagrammatically by the single-headed arrow 43, into the mesas 18, 20. The implantation process concurrently dopes the polysilicon of the gate electrode 42. Alternatively, the polysilicon of the gate electrode 42 may be in situ doped during the CVD process.

The semiconductor material of the source and drain regions 50, 52 may be doped to have n-type conductivity, in which instance the nanowire 38 (and the original SOI layer 14) has a p-type conductivity for forming p-n junctions characteristic of a field effect transistor. Suitable n-type dopants in silicon are Group V elements in the Periodic Table that include, but are not limited to, arsenic and phosphorus. Alternatively, the source and drain regions 50, 52 may be doped with a suitable p-type impurity selected from Group III elements in the Periodic Table, such as boron, and the nanowire 38 has an n-type conductivity for forming the p-n junctions. An anneal electrically activates and diffuses the implanted impurities in the source and drain regions 50, 52, as well as repairs implantation damage within the mesas 18, 20.

The gate electrode 42, gate dielectric layer 40, source and drain regions 50, 52, and nanowire 38 constitute a device structure 54. The gate dielectric layer 40 separates the gate electrode 42 from the channel region defined by the nanowire 38 so that the gate electrode 42 is not in direct electrical contact with the nanowire 38. The nanowire 38, which is masked by the gate electrode 42 when the source and drain regions 50, 52 are formed, is juxtaposed laterally on one side by the source region 50 and on the opposite side by the drain region 52. Of course, the residual peripheral ends 34, 36 of the original beam 22 physically bridge the gaps between the nanowire 38 and the source and drain regions 50, 52. The device structure 54, which is fully compatible with the complementary metal-oxide-semiconductor (CMOS) flow in materials, hardware, and technology, represents a gate-all-around (GAA) silicon nanowire or nanowire field effect transistor.

In one embodiment, the device structure 54 may be an n-channel field effect transistor in which the nanowire 38 consists of semiconductor material that is doped n-type and the source and drain regions 50, 52 consist of semiconductor material that is doped p-type. Alternatively, the device structure 54 may be a p-channel field effect transistor in which the nanowire 38 consists of semiconductor material that is doped p-type and the source and drain regions 50, 52 consist of semiconductor material that is doped n-type.

During the fabrication process, the device structure 54 is replicated across at least a portion of the surface area on a product chip region of the SOI wafer 10 and on other product chips fabricated on the SOI wafer. In one embodiment, device structures 54 that are p-channel and device structures 54 that are n-channel field effect transistors may be fabricated to form CMOS pairs as understood by a person having ordinary skill in the art.

Figure 5C:
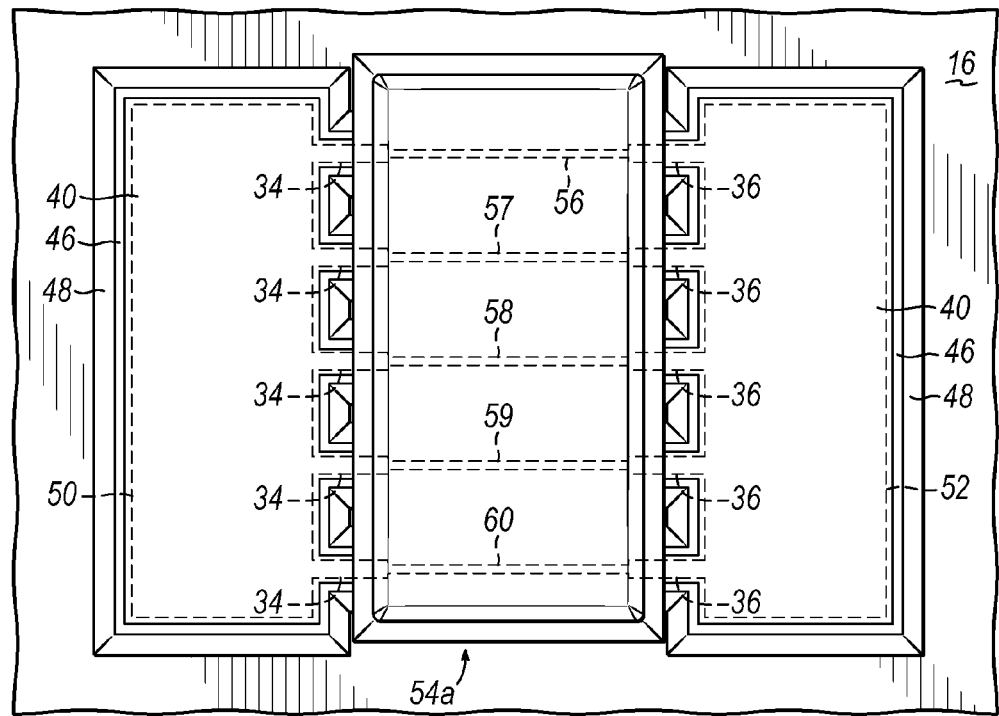
FIG. 5C is a view similar to FIG. 5A depicting a device structure in accordance with an alternative embodiment that is characterized by multiple nanowires.

In an alternative embodiment and as shown in FIG. 5C in which like reference numerals refer to like features in FIG. 5B, a device structure 54a similar to device structure 54 may include multiple representative nanowires 56, 57, 58, 59, 60 that are arranged in a linear array and that span between the source and drain regions 50, 52. The nanowires 56-60 that are surrounded in a GAA construction by the gate electrode 42 so that a control voltage applied to the gate electrode 42 is operative to cause current flow from the source region 50 to the drain region 52 through each of the nanowires 56-60. Each of the nanowires 56-60 is structured and constructed like nanowire 38. In particular, the nanowires 56-60 are concurrently fabricated using the fabrication processes of the various embodiments of the invention. For example, the body width and crystal orientation of the nanowires 56-60 can be varied to vary the carrier mobility. The specific number of nanowires 56-60 in the device structure 54a relates to the device design and is not limited to the representative number shown in FIG. 5C. The effective body width for the nanowires 56-60 in the device structure 54a is given by the product of the body width, $W_1$, of each of the individual nanowires 56-60 and the number of nanowires 56-60. The channel length is defined by the length of the nanowires 56-60 covered by the gate electrode 42.

Figure 6A:
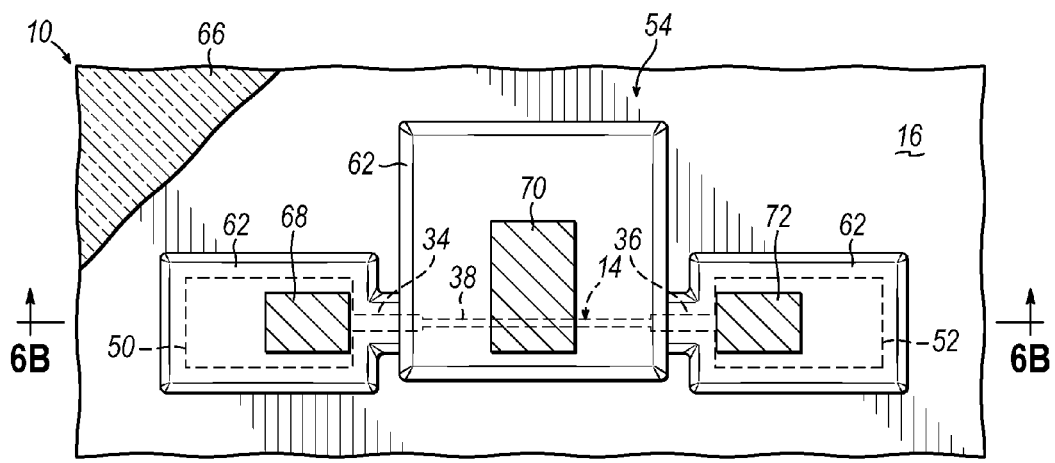
FIGS. 6A and 6B are views similar to FIGS. 5A and 5B, respectively, at a subsequent fabrication stage of the processing method.
Figure 6B:
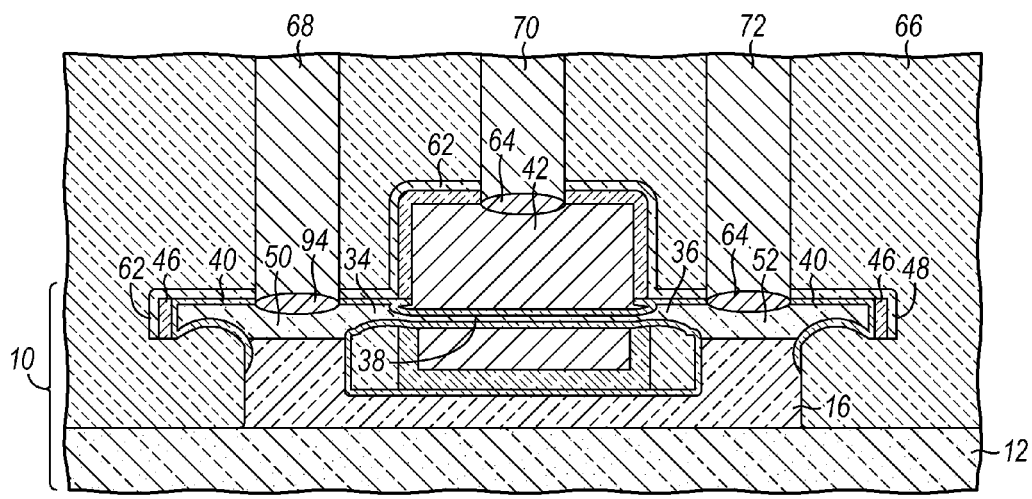

With reference to FIGS. 6A, 6B in which like reference numerals refer to like features in FIGS. 5A, 5B and at a subsequent fabrication stage, the sidewall spacers 48 are removed and a layer 62 of a dielectric material, like $Si_3N_4$, is applied on the screen layer 46. Openings are defined in the layers 46, 62 at locations appropriate for establishing electrical contacts with the gate electrode 42 and the source and drain regions 50, 52. Conductive layers 64 are respectively formed within the openings. The conductive layers 64 may be composed of a silicide material formed by a conventional silicidation process familiar to a person having ordinary skill in the art.

A dielectric layer 66 for a local interconnect (M1) metallization level is applied and contacts 68, 70, 72 are formed in the dielectric layer 66. The contacts 68, 70, 72 are composed of a material having a relatively high electrical conductivity in comparison to the dielectric material contained in the dielectric layer 66. In various embodiments, the contacts 68, 70, 72 may be composed of various different metals or metal alloys including, but not limited to, tungsten or a tungsten alloy. The contacts 68, 70, 72 are electrically coupled with the conductive layer 64 on the gate electrode 42 and with the conductive layers 64 on the source and drain regions 50, 52.

Standard processing follows, which includes the formation of interlayer dielectric layers, conductive vias, and metallization included in upper metallization levels (M2-level, M3-level, etc.) of a back-end-of-line (BEOL) wiring structure coupled with the contacts 68, 70, 72 and other similar contacts for additional device structures 54.

The device structure 54 (FIG. 5B) or the device structure 54a (FIG. 5C) may be used as a stress sensor to measure mechanical stress applied to the nanowire 38 or nanowires 56-60. Mechanical stress applied to the nanowire 38 or nanowires 56-60 causes a change in the carrier mobility, which is manifested in a measurable electrical characteristic such as the output conductance. Specifically, the response of the carrier mobility to mechanical stress depends, among other factors, on the orientation of the nanowire(s) and the body width of each individual nanowire. The magnitude of the applied mechanical stress is monitored by its impact on an electrical characteristic, such as the measured output conductance of the device structure 54 (FIG. 5B) or the device structure 54a (FIG. 5C). The measured output conductance can be related to the magnitude of the applied tensile stress through a mathematical relationship. For constructions with multiple nanowires 56-60 in parallel as in the representative device structure 54a, the total output conductance is equal to the sum of the output conductance of each individual nanowire.

The mechanical stress applied to an object may be measured by transferring the mechanical stress from the object 75 (FIG. 10) to the nanowire 38 in device structure 54 (FIG. 5B) or to the nanowires 56-60 in device structure 54a (FIG. 5C). The nanowire 38 or nanowires 56-60 are permitted to change in length in response to the transferred mechanical stress. In response to change in length, a numerical value of the electrical characteristic is measured. A magnitude of the mechanical stress is deduced from the numerical value of the characteristic. The nanowire 38 or nanowires 56-60 is subject to a tensile stress when the mechanical stress is absent. The measured numerical value of the electrical characteristic may be corrected using a numerical value of the electrical characteristic determined when the mechanical stress is absent. The correction may amount to a subtractive offset to the numerical value observed when the mechanical stress is applied to the object 75 (FIG. 10) and transferred to the device structure 54, 54a.

The device structures 54, 54a may be used themselves as stress sensors or, alternatively and as described below, may be incorporated as components into stress sensor circuits based upon an operational amplifier design.

Figure 8:
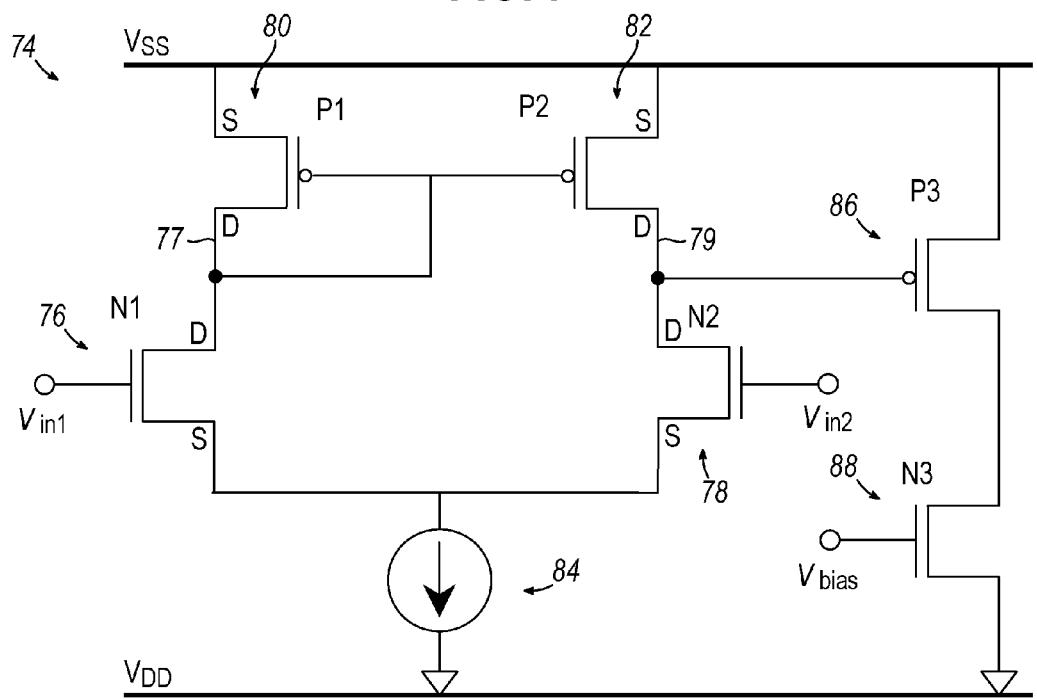
FIG. 8 is a diagrammatic view of a stress sensor integrated circuit employing a plurality of the device structures of FIG. 5C in accordance with an embodiment of the invention.
Figure 9:
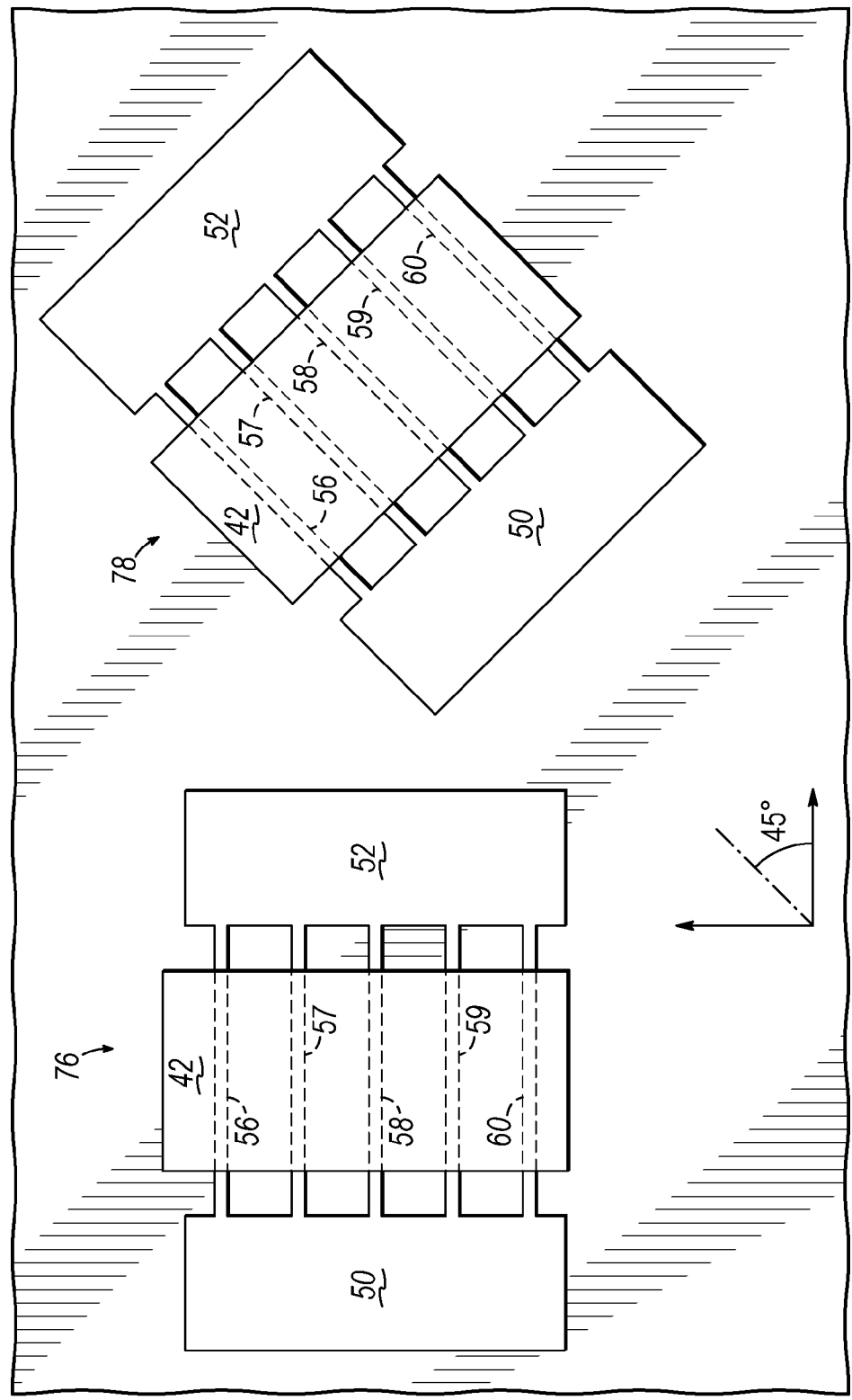
FIG. 9 is a detailed diagrammatic view showing a portion of the stress sensor circuit of FIG. 8.

With reference to FIGS. 8, 9 and in accordance with an embodiment of the invention, a two-stage CMOS operational amplifier 74 is constructed using the device structures 54, 54a and is used as a stress sensor integrated circuit. The differential-input/single-ended-output input stage of the operational amplifier 74 includes a pair of n-channel field effect transistors indicated generally by reference numerals 76, 78, respectively, that operate as input transistors and a pair of p-channel field effect transistors indicated generally by reference numerals 80, 82, respectively, that function as drive transistors. The operational amplifier 74 also includes a constant current source 84. The input transistors 76, 78 are electrically connected in parallel, as are the drive transistors 80, 82. The load transistors 80, 82 are connected between output nodes 77, 79 of the input transistors 76, 78 and a positive power supply node ($V_{ss}$). The drain regions, D, of the load transistors 80, 82 are coupled by the output nodes 77, 79 with the drain regions, D, of the input transistors 76, 78. The gates of the load transistors 80, 82 are coupled with each other, as well as with the output node 77. The source regions, S, of the drive transistors 80, 82 are connected to the positive power supply node. The source regions, S, of the input transistors 76, 78 are connected to a negative power supply node ($V_{dd}$) through the constant current source 84.

The output stage of the operational amplifier 74 is a single-ended gain stage with a driver, represented by a conventional p-channel field effect transistor, P3, and a current source load, represented by a conventional n-channel field effect transistor, N3, which are indicated generally by reference numerals 86, 88, respectively. The operational amplifier 74 is configured to operate as a comparator that is capable of producing an output offset voltage $V_{OS,out}$ for a mismatched but nearly matched pair of input transistors 76, 78, a mismatched but nearly matched pair of output transistors 80, 82, or both.

In one embodiment of the invention, the input transistors 76, 78 are GAA nanowire re-channel field effect transistors with one of the device structures 54, 54a. The nanowire(s) of the n-channel field effect transistors 76, 78 are aligned along two different crystalline orientations. For example, the crystalline orientation of the nanowire(s) of n-channel field effect transistor 76 may be aligned with a (100) crystal plane of silicon and the crystalline orientation of the nanowire(s) of the n-channel field effect transistor 78 may be aligned with a (110) crystal plane of silicon, as reflected by the 45° difference apparent in FIG. 9. Hence, the orientation of the nanowires of transistors 76, 78 are contained within the (100) and (110) crystal planes, respectively. The p-channel field effect transistors 80, 82 have a conventional device construction. The body widths or effective body widths of the nanowire(s) in the different transistors 76, 78 are approximately equal.

The output offset voltage $V_{OS,out}$ of the operational amplifier 74 will depend on the stress response difference between the nanowire(s) of the n-channel field effect transistors 76, 78. The magnitude of the output offset voltage $V_{OS,out}$ is mathematically related to the electronic mobility, which is impacted by crystalline orientation and width of the constituent nanowires, and, hence, is mathematically related to the magnitude of the mechanical stress applied to the nanowire(s) in the transistors 76, 78.

In an alternative embodiment, the p-channel field effect transistors 80, 82 are GAA nanowire field effect transistors having nanowire(s) that are aligned along two different crystalline orientations, e.g., contained within a (110) plane for transistor 80 and contained within a (010) plane for transistor 82. The n-channel field effect transistors 76, 78 may have a conventional structure. The body widths or effective body widths of the nanowire(s) in the different transistors 80, 82 are approximately equal. The output offset voltage $V_{OS,out}$ of the operational amplifier 74 will depend on the stress response difference between the nanowire(s) of the p-channel field effect transistors 80, 82. The magnitude of the output offset voltage $V_{OS,out}$ is mathematically related to the electronic mobility, which is impacted by crystalline orientation and width of the constituent nanowires, and, hence, is mathematically related to the magnitude of a tensile stress applied to the nanowire(s) in the transistors 80, 82.

In yet another alternative embodiment, the n-channel field effect transistors 76, 78 and the p-channel field effect transistors 80, 82 may be GAA nanowire field effect transistors nanowire(s) structured like either device structure 54 or device structure 54a. In one specific embodiment, the nanowire(s) of the n-channel field effect transistors 76, 78 are aligned with different crystalline orientations and the nanowire(s) of the p-channel field effect transistors 80, 82 are aligned with nominally the same crystalline orientation. In another specific embodiment, the nanowire(s) of the p-channel field effect transistors 80, 82 are aligned with different crystalline orientations and the nanowire(s) of the n-channel field effect transistors 76, 78 are aligned with nominally the same crystalline orientation. In yet another specific embodiment, the nanowire(s) of the p-channel field effect transistors 80, 82 and the nanowire(s) of the n-channel field effect transistors 76, 78 are aligned with different crystalline orientations. The body widths or effective body widths of the nanowire(s) in the different transistors 76, 78 are approximately equal and the body widths or effective body widths of the nanowire(s) in the different transistors 80, 82 are approximately equal.

Figure 10:
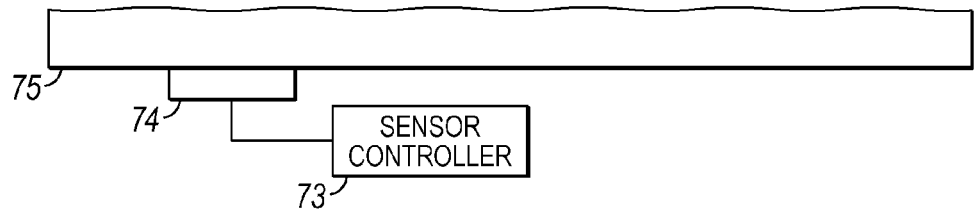
FIG. 10 is a diagrammatic view illustrating the attachment of the stress sensor or stress sensor integrated circuit to an object for use in detecting stresses applied to the object.

The operational amplifier 74 is configured for use as a stress sensor circuit capable of monitoring an external mechanical stress applied to an object. To that end and as shown in FIG. 10, the operational amplifier 74 may be mechanically secured or attached to an object 75. A mechanical stress applied to the object 75 is translated to a strain, which is transferred from the object 75 to the transistors 76, 78, 80, 82 of the operational amplifier 74. The transferred dimensional changes to the nanowire(s) in the transistors 76, 78 modifies the tensile stress applied to the nanowire(s). An input device mismatch results for transistors 76, 78, for transistors 80, 82, or to both sets of transistors because of the width difference or crystalline orientation difference. As the external stress applied to the object 75 is modulated, the output from the operational amplifier 74 is likewise modulated as the mechanical stress applied to the nanowires changes.

The output from the operational amplifier 74 is routed to a sensor controller 73, which analyzes the output offset voltage $V_{OS,out}$ and determines a magnitude for the applied mechanical stress from the output offset voltage $V_{OS,out}$. As part of the analysis, the sensor controller 73 may analyze the output offset voltage $V_{OS,out}$ in the absence of an applied mechanical stress and determine a numerical value for the offset voltage $V_{OS,out}$ (or the output conductance if device structures 54, 54a are used directly as stress sensors). In this instance, a correction factor is generated that originates from the inherent tensile stress on the nanowire(s).

The sensor controller 73 may include a processor that is coupled with the operational amplifier 74 and a memory coupled with the processor. The processor may represent one or more individual processors (e.g., microprocessors), and the memory may represent the random access memory (RAM) devices comprising the main storage of the sensor controller 73, as well as any supplemental levels of memory, e.g., cache memories, non-volatile or backup memories (e.g., programmable or flash memories), read-only memories, etc. In addition, the memory may be considered to include memory storage physically located elsewhere in the sensor controller 73, e.g., any cache memory in a processor, as well as any storage capacity used as a virtual memory, e.g., as stored on a mass storage device. The mass storage device may contain a cache or other data storage, which may include one or more databases.

The sensor controller 73 also typically receives a number of inputs and outputs for communicating information externally. For interfacing with a user or operator, the sensor controller 73 typically includes a user interface with one or more input devices, such as a keyboard, a mouse, a trackball, a joystick, a touchpad, a keypad, a stylus, and/or a microphone, among others. The sensor controller 73 may also include a display, such as a CRT monitor, an LCD display panel, and/or a speaker, among others, or other type of output device, such as a printer.

The sensor controller 73 operates under the control of an operating system and executes or otherwise relies upon various computer software applications, components, programs, objects, modules, data structures, etc. In general, the routines executed to implement the embodiments of the invention for sensing mechanical stresses, whether implemented as part of an operating system or a specific application, component, program, object, module or sequence of instructions as a program code. The program code typically comprises one or more instructions that are resident at various times in various memory and storage devices in a computer, and that, when read and executed by one or more processors in a computer, causes that computer to perform the steps necessary to execute steps or elements embodying the various aspects of the invention.

Alternatively, the sensor controller 73 may also be coupled with one of the device structures 54, 54a, which may also be mechanically attached to the object 75 and operate as stress sensors. In this instance, the sensor controller 73 receives output conductance or another electrical characteristic as input data for analysis and determination of a stress magnitude.

Figure 11:
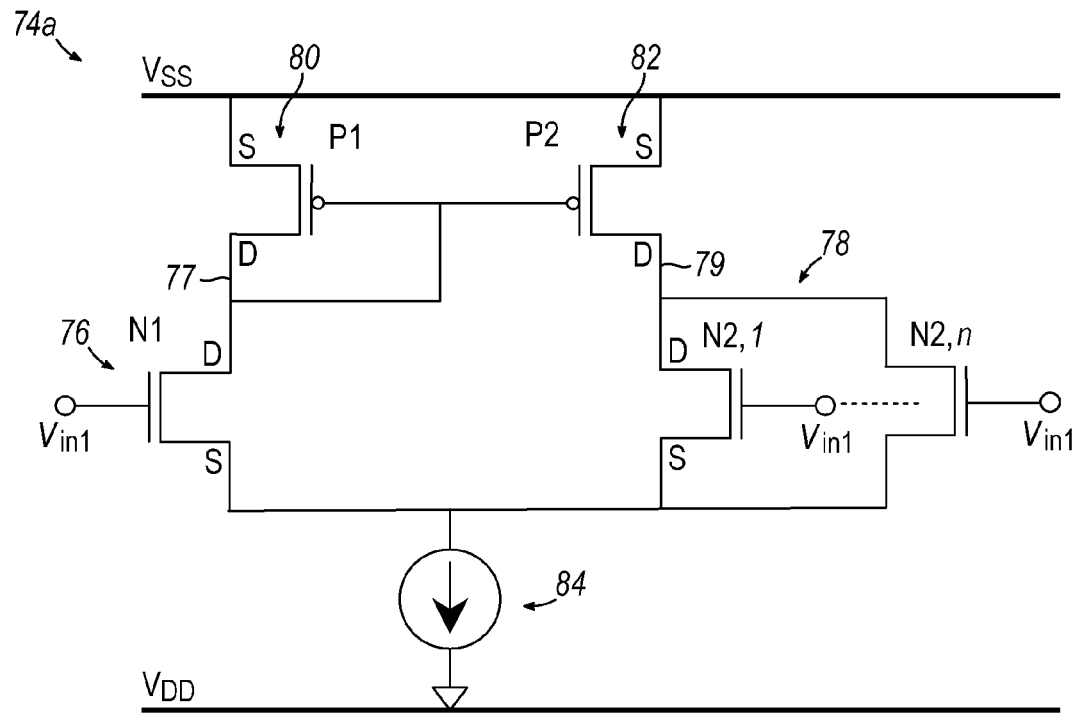
FIG. 11 is a diagrammatic view of a stress sensor integrated circuit similar to FIG. 8 in accordance with an alternative embodiment of the invention.

With reference to FIG. 11 in which like features refer to like reference numerals in FIG. 8 and in accordance with an alternative embodiment, a two-stage CMOS operational amplifier 74a is constructed using the device structures 54, 54a and is configured for use as a stress sensor integrated circuit. Operational amplifier 74a is similar in construction to operational amplifier 74 (FIG. 8) but differs in several aspects. In one aspect, field effect transistors 76, 78, 80, 82 all have one nanowire 38 as in device structure 54 that are aligned with nominally identical crystalline orientations or multiple nanowires 56-60 as in device structure 54a that are aligned with nominally identical crystalline orientations.

The operational amplifier 74a, which is operating as a differential amplifier or comparator, is capable of producing an output offset voltage $V_{OS,out}$ for a mismatched pair of input transistors 76, 78, a mismatched pair of output transistors 80, 82, or both circumstances. In this embodiment of the invention, nanowire body widths are modulated to generate the output offset voltage $V_{OS,out}$. The magnitude of the output offset voltage $V_{OS,out}$ is mathematically related to the electronic mobility, which is impacted by body width, and, hence, is mathematically related to the magnitude of a tensile stress applied to the nanowire(s) of the device structures 54, 54a.

As shown in FIG. 11, the n-channel field effect transistors 76, 78 are GAA nanowire transistors and the number of nanowires in field effect transistor 76 differs from the number of nanowires in the transistor 78. However, by adjusting the individual body widths for the nanowires, the effective body widths for the transistors 76, 78 are approximately equivalent. To that end, the individual nanowires of transistor 78 are fabricated with a smaller physical body width than the individual nanowire or nanowires of transistor 76, but transistor 78 contains more individual nanowires than transistor 76 so that the effective body widths are nominally equal. For example, transistor 76 may include a single nanowire of a given body width and transistor 78 may include ten (10) nanowires each having one tenth of the body width of the nanowire of transistor 76. Transistors 80, 82 may have a conventional construction for a field effect transistor.

In an alternative embodiment, the p-channel field effect transistors 80, 82 are GAA nanowire transistors and the number of nanowires in field effect transistor 80 differs from the number of nanowires in the transistor 82. However, by adjusting the individual body widths for the nanowires, the effective body widths for the transistors 80, 82 are approximately equivalent. To that end, the individual nanowires of transistor 82 are fabricated with a smaller physical body width than the individual nanowire or nanowires of transistor 80, but transistor 82 contains more individual nanowires than transistor 80 so that the effective body widths are nominally equal. For example, transistor 80 may include a single nanowire of a given body width and transistor 82 may include ten (10) nanowires each having one tenth of the body width of the nanowire of transistor 80. Transistors 76, 78 may have a conventional construction for a field effect transistor In yet another alternative embodiment, the n-channel field effect transistors 76, 78 and the p-channel field effect transistors 80, 82 are GAA nanowire transistors. In one specific embodiment, the number of nanowires in field effect transistor 80 differs from the number of nanowires in the transistor 82, and the number of nanowire(s) in field effect transistors 76, 78 is the same. In another specific embodiment, the number of nanowires in field effect transistor 76 differs from the number of nanowires in the transistor 78, and the number of nanowire(s) in field effect transistors 80, 82 is the same. In yet another specific embodiment, the number of nanowires in field effect transistor 76 differs from the number of nanowires in the transistor 78, and the number of nanowires in field effect transistor 80 differs from the number of nanowires in the transistor 82. By adjusting the individual body widths for the nanowires, as described above, the effective body widths for the transistors 76, 78 are approximately equivalent and the effective body widths for the transistors 80, 82 are approximately equivalent.

In various additional alternative embodiments, different permutations of the differential body widths (FIG. 11) and differential crystalline orientations (FIG. 8) for the nanowire(s) may be made to provide a matrix of different combinations for the operational amplifiers 74, 74a.

Figure 12:
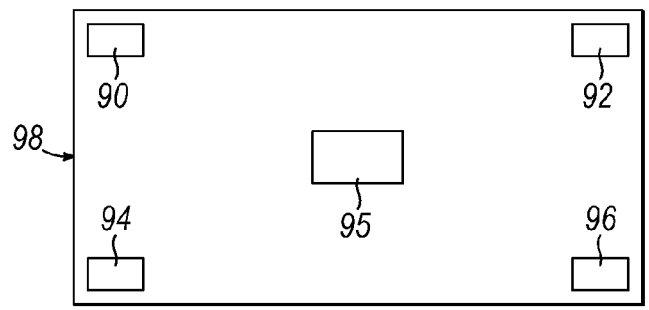
FIG. 12 is a diagrammatic view of a semiconductor die with a plurality of stress sensors or stress sensor integrated circuits distributed across the die surface area and constructed in accordance with an embodiment of the invention.

With reference to FIG. 12 and in accordance with an embodiment of the invention, a plurality of nanowire stress gauges 90, 92, 94, 95, 96 are distributed across the surface of a product chip 98 carrying an integrated circuit containing field effect transistors fabricated by CMOS processes. The nanowire stress gauges 90, 92, 94, 95, 96 may assume the form of the devices like device structures 54, 54a or the form of the stress sensor circuits represented by the operational amplifiers 74, 74a, and are built as portions of the integrated circuit fabricated on the product chip 98. Distributing the nanowire stress gauges 90, 92, 94, 95, 96 across the product chip 98 may be beneficial for monitoring cross-chip variations in stress induced by the CMOS process and integrated circuit. The nanowires of the nanowire stress gauges 90, 92, 94, 95, 96 and the CMOS field effect transistors are constructed in the same SOI layer 14 on the very same product chip 98.

Figure 13:
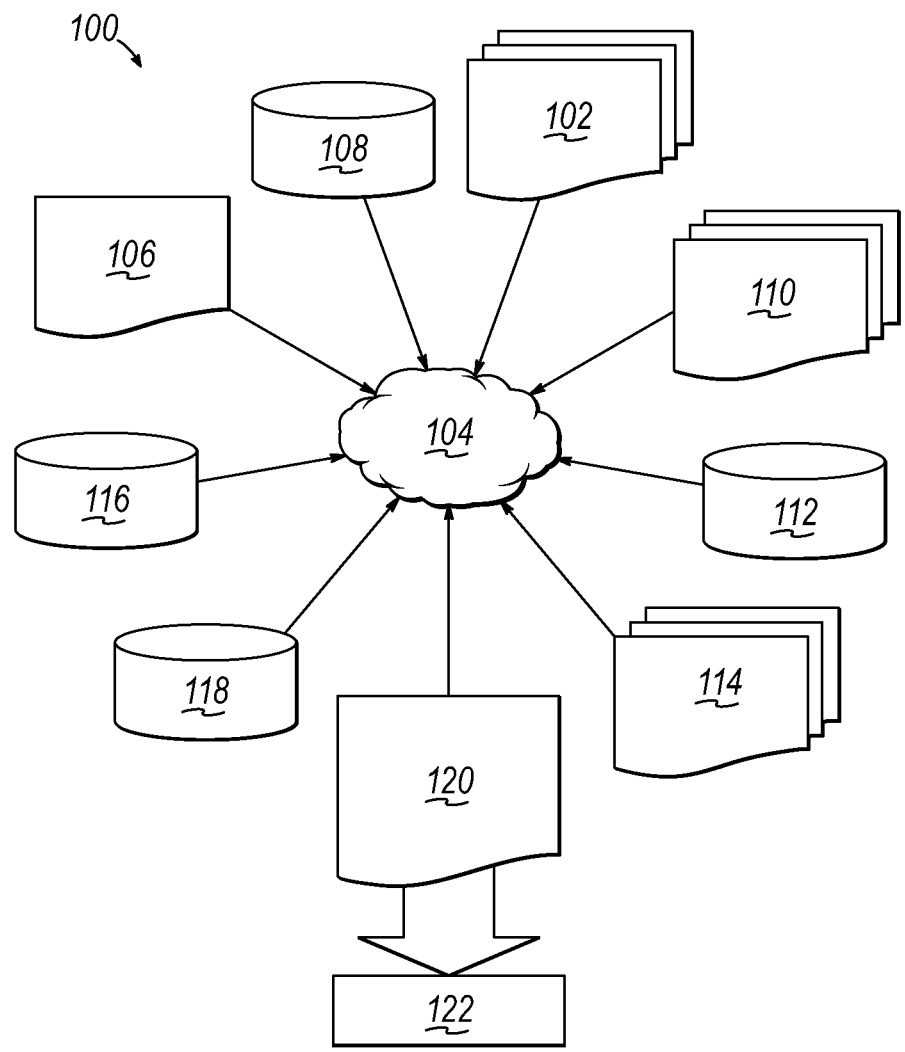
FIG. 13 is a flow diagram of a design process used in semiconductor design, manufacture, and/or test.

FIG. 13 shows a block diagram of an exemplary design flow 100 used for example, in semiconductor IC logic design, simulation, test, layout, and manufacture. Design flow 100 includes processes and mechanisms for processing design structures or devices to generate logically or otherwise functionally equivalent representations of the design structures and/or devices described above and shown in FIGS. 6A,B, 8, 11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 6A,B, 8, 11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 6A,B, 8, 11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6A,B, 8, 11. In one embodiment, design structure 120 may comprise a compiled, executable HDL simulation model that functionally simulates the devices shown in FIGS. 6A,B, 8, 11.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6A,B, 8, 11. Design structure 120 may then proceed to a stage 122 where, for example, design structure 120: proceeds to tape-out, is released to manufacturing, is released to a mask house, is sent to another design house, is sent back to the customer, etc.

Example

Figure 14:
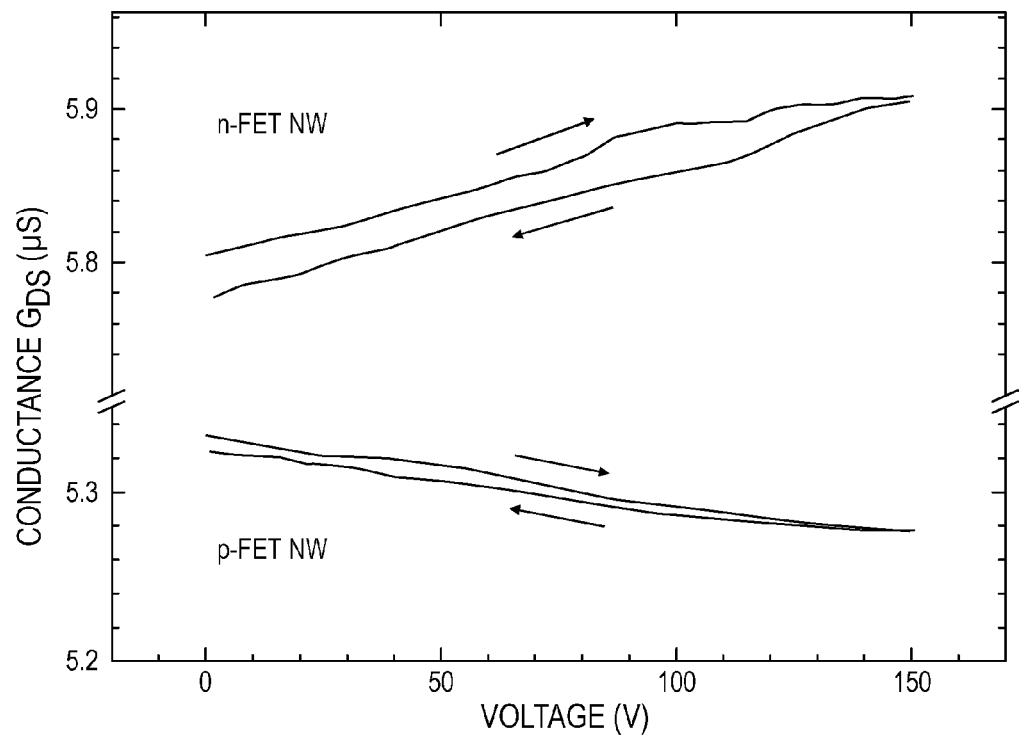
FIG. 14 is a graphical view showing the dependence of mobility exhibited by a nanowire device structure of an embodiment of the invention when attached to an object and exposed to an applied mechanical stress of changing magnitude transferred from the object to the nanowire device structure.

With reference to FIG. 14, nanowire device structures were fabricated that were similar in construction to the device structure 54a of FIG. 5C. Each nanowire device structure included a channel region consisting of 100 nanowires each having a body width, $W_1$, of about 15 nm, a channel length, $L_{des}$, of about 0.8 microns, and a separation between the source and drain regions of about 1 micron. The source and drain regions of one type of device structure were doped with arsenic to form an n-channel GAA nanowire field effect transistor. The source and drain regions of the complementary type of device structure were doped with boron to form a p-channel GAA nanowire field effect transistor.

The n-channel GAA nanowire field effect transistor was mechanically coupled with a body of piezoelectric material, such as lead zirconate titanate (PZT), that is capable of converting electrical energy into a mechanical displacement. The piezoelectric element is composed of a material that exhibits a marked piezoelectric effect. When potential difference is applied to the piezoelectric material of the piezoelectric element, the body changes shape or size. A strain gauge was mounted to the body of piezoelectric material. The nanowires of the n-channel GAA nanowire field effect transistor were approximately aligned parallel to the polling direction of the body of piezoelectric material.

The potential difference, $V_{Pz}$, applied to the body of piezoelectric material, was incrementally ramped upwardly from about 0 volts to about 150 volts and then reversed to return downwardly from 150 volts to 0 volts. A drain-to-source potential difference of about 100 millivolts and a gate-to-source potential difference with an absolute value of about 10 millivolts were applied to the n-channel GAA nanowire field effect transistor. At each incremental applied voltage, the tensile stress was measured with the strain gauge and the output conductance, $G_{ds}$, in microsiemens (µS) was measured using a circuit known to a person having ordinary skill in the art.

The results of these electrical measurements are graphically plotted in FIG. 14. As the applied stress from the body of piezoelectric material is ramped upwardly toward a maximum of 200 megaPascals, the device output conductance (and hence electron mobility) increases approximately linearly until the highest applied stress values are approached. As the applied stress is removed, the conductance decreases with approximately the same linear dependence. This demonstrates the sensitivity of the n-channel GAA nanowire field effect transistor to variations in applied stress and reflects the ability to measure stress using the n-channel GAA nanowire field effect transistor.

Also plotted on FIG. 14 are the results for a p-channel GAA nanowire field effect transistor constructed nominally equivalent to the n-channel GAA nanowire field effect transistor, except for the doping of the source and drain regions. As the applied stress from the body of piezoelectric material is ramped upwardly toward a maximum of 200 megaPascals, the device output conductance (and hence hole mobility) decreases approximately linearly until the highest applied stress values are approached. As the applied stress is removed, the conductance increases with approximately the same linear dependence. This demonstrates the sensitivity of the p-channel GAA nanowire field effect transistor to variations in applied stress and reflects the ability to measure stress using the p-channel GAA nanowire field effect transistor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for sensing a mechanical stress applied to an object, the method comprising:
    transferring the mechanical stress from the object as a first tensile stress to at least one silicon nanowire in a first stress sensor mechanically coupled with the object;
    in response to the tensile stress transferred to the at least one silicon nanowire of the first stress sensor, measuring a first numerical value for an electrical characteristic of the first stress sensor; and
    determining a first magnitude of the mechanical stress from the first numerical value of the electrical characteristic,
    wherein a sensitivity of the first stress sensor to the tensile stress is determined by selecting a body width of the at least one silicon nanowire to establish a carrier mobility.

2. The method of claim 1 wherein the at least one silicon nanowire is subject to a second tensile stress when the mechanical stress is absent, and determining the first magnitude of the mechanical stress comprises:
    determining a second numerical value for the electrical characteristic in response to the second tensile stress; and
    correcting the first numerical value for the electrical characteristic using the second numerical value of the electrical characteristic.

3. The method of claim 1 wherein the first stress sensor further includes a source region, a drain region, and a gate electrode, the at least one silicon nanowire extends from the source region to the drain region, and the gate electrode extends circumferentially about the at least one silicon nanowire between the source region and the drain region.

4. The method of claim 1 wherein the electrical characteristic is an output conductance of the first stress sensor.

5. The method of claim 1 wherein the object is a product chip, and the first stress sensor is fabricated as a device structure on a product chip along with an integrated circuit fabricated on the product chip.

6. The method of claim 5 further comprising:
    transferring the mechanical stress from the object as a second tensile stress to at least one silicon nanowire in a second stress sensor fabricated as another device structure at a different location on the product chip;
    in response to the second tensile stress transferred to at least one silicon nanowire of the second stress sensor, measuring a second numerical value of the electrical characteristic of the at least one nanowire of the second stress sensor;
    converting the second numerical value of the electrical characteristic into a second magnitude of the mechanical stress; and
    comparing the first and second numerical values to assess differences between the first and second magnitudes of the mechanical stress across the die to detect cross-chip stress variations.

7. The method of claim 1 wherein the body width of the at least one silicon nanowire of the first stress sensor is further selected to establish a measurement range for the mechanical stress.

8. A method for sensing a mechanical stress applied to an object, the method comprising:
- transferring the mechanical stress from the object to at least one nanowire acting as a channel region in a first field effect transistor and at least one nanowire acting as a channel region in a second field effect transistor that is connected in parallel with the first field effect transistor;
- permitting the at least one nanowire of the first field effect transistor and the at least one nanowire of the second field effect transistor to each receive a tensile stress in response to the mechanical stress;
- in response to the respective receipt of tensile stress, determining a difference between a first voltage output from the first field effect transistor and a second voltage output from the second field effect transistor; and
- determining a value for the mechanical stress from the difference between the first and second voltages.

9. The method of claim 8 wherein the first and second field effect transistors are input devices for an operational amplifier, and further comprising:
- transferring the first voltage from the first field effect transistor to a third field effect transistor electrically connected with an output node of the first field effect transistor; and
- transferring the second voltage from the second field effect transistor to a fourth field effect transistor electrically connected with an output node of the second field effect transistor.

10. The method of claim 9 wherein each of the first and second field effect transistors includes a source region, a drain region, and a gate electrode, the at least one nanowire extends from the source region to the drain region, and the gate electrode extends circumferentially about the at least one nanowire between the source region and the drain region.

11. The method of claim 10 wherein each of the third and fourth field effect transistors includes a source region, a drain region, at least one nanowire extending from the source region to the drain region, and a gate electrode extending circumferentially about the at least one nanowire between the source region and the drain region.

12. The method of claim 8 wherein the first and second field effect transistors are drive devices for an operational amplifier, and further comprising:
- supplying the first voltage from a third field effect transistor to the first field effect transistor; and
- supplying the second voltage from a fourth field effect transistor to the second field effect transistor.

13. The method of claim 12 wherein each of the first and second field effect transistors includes a source region, a drain region, and a gate electrode, the at least one nanowire extends from the source region to the drain region, and the gate electrode extends circumferentially about the at least one nanowire between the source region and the drain region.

14. The method of claim 13 wherein each of the third and fourth field effect transistors includes a source region, a drain region, at least one nanowire composed of silicon and extending from the source region to the drain region, and a gate electrode extending circumferentially about the at least one nanowire between the source region and the drain region.

15. The method of claim 8 wherein the at least one nanowire of the first field effect transistor and the at least one nanowire of the second field effect transistor each change in length in response to receiving the tensile stress.

16. The method of claim 1 wherein the at least one silicon nanowire of the first stress sensor changes in length in response to receiving the first tensile stress.

17. The method of claim 6 wherein the at least one silicon nanowire of the second stress sensor changes in length in response to receiving the second tensile stress.

* * * * *